(12) United States Patent  (10) Patent No.: US 8,420,213 B2
Suzuki et al.  (45) Date of Patent: Apr. 16, 2013

(54) COMPOSITE SUBSTRATE AND METHOD FOR FORMING METAL PATTERN

(75) Inventors: Kenji Suzuki, Nagoya (JP); Yasunori Iwasaki, Kitanagoya (JP); Takashi Yoshino, Ama-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 514 days.

(21) Appl. No.: 12/637,967

(22) Filed: Dec. 15, 2009

(65) Prior Publication Data

US 2010/0167215 A1 Jul. 1, 2010

(30) Foreign Application Priority Data

Dec. 25, 2008 (JP) .................. 2008-331010

(51) Int. Cl.
*B32B 27/04* (2006.01)
(52) U.S. Cl.
USPC ........................................... 428/344
(58) Field of Classification Search .......... 428/344, 428/354, 414, 415, 446
See application file for complete search history.

(56) References Cited

U.S. PATENT DOCUMENTS

| | | | | |
|---|---|---|---|---|
| 5,474,589 A | * | 12/1995 | Ohga et al. | 65/397 |
| 2003/0090173 A1 | | 5/2003 | Sakaguchi et al. | |
| 2007/0296306 A1 | | 12/2007 | Hauser et al. | |

FOREIGN PATENT DOCUMENTS

| | | | |
|---|---|---|---|
| DE | 102 43 585 A1 | | 7/2003 |
| DE | 10 2004 045 181 A1 | | 3/2006 |
| JP | 07-300684 A1 | | 11/1995 |
| JP | 10-233641 | * | 9/1998 |
| JP | 10-297931 | * | 11/1998 |

OTHER PUBLICATIONS

English translation of JP Publication 10-297931, Nov. 1998.*
English translation of JP Publication 10-233641, Sep. 1998.*

* cited by examiner

*Primary Examiner* — Brittany Raymond
(74) *Attorney, Agent, or Firm* — Burr & Brown

(57) ABSTRACT

A composite substrate is a piezoelectric substrate that is transparent to light used for photolithography, and a supporting substrate for supporting the piezoelectric substrate are bonded together via an organic adhesive layer. Where at least one of the supporting substrate and the organic adhesive layer of the composite substrate absorbs light used for photolithography.

8 Claims, 7 Drawing Sheets

COMPOSITE SUBSTRATE AND METHOD FOR FORMING METAL PATTERN

BACKGROUND OF THE INVENTION

1. Field of the Invention

The present invention relates to a composite substrate and a method for forming metal pattern.

2. Description of the Related Art

It is known that the formation of a desired metal pattern on a surface of a substrate by photolithography involves forming a resist pattern using a photoresist, forming a thin metal film layer on the surface on which the resist pattern is formed, and then removing the resist to form the desired metal pattern. This method is generally referred to as a lift-off process. For example, in a method for forming a thin metal film pattern described in Patent Document 1, after a resist pattern is formed on a substrate, a thin metal film layer is formed by sputtering. After immersion in a stripping solution for the resist pattern, an ultrasonic wave is applied to remove the resist pattern and an unnecessary portion of the thin metal film layer disposed on the resist pattern.

[Patent Documents]

[Patent Document 1] Japanese Unexamined Patent Application Publication No. 07-300684 (paragraph [0004])

Also in a composite substrate in which a piezoelectric substrate is bonded to a supporting substrate with an organic adhesive layer interposed therebetween, a desired metal pattern may be formed by the lift-off process, as described in Patent Document 1. In the formation of a resist pattern by photolithography, a photoresist is applied to a surface of the piezoelectric substrate of the composite substrate, a photomask corresponding to a desired metal pattern is placed on the piezoelectric substrate, the photoresist is irradiated with light through the photomask, and development of the photoresist after removal of the photomask yields the resist pattern.

SUMMARY OF THE INVENTION

However, light passes through a piezoelectric substrate, an organic adhesive layer, and a supporting substrate, which are each in the form of a thin film. For example, as illustrated in FIG. 8, the i-line (wavelength: 365 nm) transmittance is approximately 95% for a lithium tantalite piezoelectric substrate having a thickness of 30 μm, approximately 90% for an epoxy resin organic adhesive layer having a thickness of 1 μm, approximately 90% for a borosilicate glass supporting substrate having a thickness of 250 μm, and approximately 77% for a composite substrate of these three layers bonded together. In such a case, light may be reflected by the bottom of the supporting substrate or the surface of a base on which the composite substrate is disposed and reach the back side of a portion of a photoresist covered with a photomask. The portion of the photoresist is therefore undesirably exposed to light, and a desired resist pattern cannot be formed. Thus, a desired metal pattern also cannot be formed. Furthermore, when the supporting substrate is formed of a reflective material (for example, silicon), light is also reflected by the surface of the supporting substrate, causing the same problem.

In view of the problem described above, it is a principal object of the present invention to form a desired metal pattern with a high degree of precision by a lift-off process in a composite substrate in which a piezoelectric substrate is bonded to a supporting substrate with an organic adhesive layer interposed therebetween.

Means for Solving the Problems

To achieve this object, the present invention has employed the following means.

A composite substrate according to a first aspect of the present invention is a composite substrate in which a piezoelectric substrate that is transparent to light used for photolithography and a supporting substrate for supporting the piezoelectric substrate are bonded together via an organic adhesive layer, wherein at least one of the supporting substrate and the organic adhesive layer can absorb the light used for photolithography.

A composite substrate according to the first aspect of the present invention has a desired metal pattern formed on a surface of a piezoelectric substrate by a lift-off process using photolithography. In a process for forming a metal pattern by a lift-off process using photolithography, for example, a photoresist is first applied to a surface of a piezoelectric substrate of a composite substrate. The next step involves placing a photomask corresponding to a desired metal pattern on or above the piezoelectric substrate, irradiating the photoresist with light through the photomask, removing the photomask, and developing the photoresist to form a resist pattern. The subsequent step involves forming a metal layer on the surface on which the resist pattern is formed and subsequently removing the resist pattern on which an unnecessary portion of the metal layer is disposed to form a desired metal pattern. If the supporting substrate and the organic adhesive layer are formed of a material that is transparent to light used for photolithography, light passing through the photoresist passes through the piezoelectric substrate, the organic adhesive layer, and the supporting substrate in this order, is reflected by the bottom of the supporting substrate or the surface of a base on which the composite substrate is disposed, and passes through the supporting substrate, the organic adhesive layer, and the piezoelectric substrate in this order, and a portion of the photoresist on the back side of the photomask may be exposed to light. In a composite substrate according to the present invention, however, at least one of an organic adhesive layer and a supporting substrate absorbs light used for photolithography, light passing through a photoresist is absorbed by at least one of the organic adhesive layer and the supporting substrate. A portion of the photoresist on the back side of a photomask is therefore not exposed to light. Thus, in a composite substrate in which a piezoelectric substrate is bonded to a supporting substrate with an organic adhesive layer interposed therebetween, a desired metal pattern can be formed with a high degree of precision by a lift-off process using photolithography.

In a composite substrate according to the first aspect of the present invention, the organic adhesive layer may be formed of a material in which a light-absorbing component for example, an ultraviolet-absorbing component) is added to an adhesive composition. Examples of the adhesive composition include an epoxy resin and an acrylic resin. Examples of the light-absorbing component include carbon and titanium. In this case, the supporting substrate may be a supporting substrate formed of silicon. Since silicon has high reflectivity, it is important that an organic adhesive layer absorbs light used for photolithography.

In a composite substrate according to the first aspect of the present invention, the supporting substrate may be formed of a material in which a light-absorbing component (for example, an ultraviolet-absorbing component) is added to a glass composition. Examples of the glass composition include soda-lime-silica glass, borosilicate glass, non-alkali glass, and quartz glass. Examples of the light-absorbing component include metal oxides, such as iron oxide, cerium oxide, titanium oxide, and zinc oxide. Those in which a light-absorbing component is added to a glass composition are described in Japanese Unexamined Patent Application Publication No. 10-152349, for example. Preferably, light used for photolithography has a wavelength of 350 nm or more. Because light having a wavelength of 350 nm or more can easily pass through glass, the application of the present invention has great significance.

A composite substrate according to a second aspect of the present invention, comprises;

a piezoelectric substrate that is transparent to light used for photolithography;

a supporting substrate that is transparent to the light used for photolithography;

a first organic adhesive layer that is transparent to the light used for photolithography and bonds the piezoelectric substrate and the supporting substrate together; and a second organic adhesive layer formed on a surface of the supporting substrate opposite the first organic adhesive layer, wherein the second organic adhesive layer can absorb the light used for photolithography.

In a composite substrate according to the second aspect of the present invention, when a desired metal pattern is formed on a surface of a piezoelectric substrate by a lift-off process using photolithography, light passing through a photoresist passes through the piezoelectric substrate, a first organic adhesive layer, and a supporting substrate in this order and is absorbed by a second organic adhesive layer. A portion of the photoresist on the back side of a photomask is therefore not exposed to light. As in a composite substrate according to the first aspect of the present invention, therefore, a desired metal pattern can be formed with a high degree of precision by a lift-off process using photolithography. The second organic adhesive layer may be formed of a material in which a light-absorbing component is added to an adhesive composition.

A composite substrate according to the second aspect of the present invention may further includes a metallic foil or a compensating substrate bonded to the supporting substrate via the second organic adhesive layer, wherein the piezoelectric substrate has a higher thermal expansion coefficient than the supporting substrate, and the metallic foil or the compensating substrate has a higher thermal expansion coefficient than the supporting substrate. With such a structure, the supporting substrate can reduce variations in the size of the piezoelectric substrate resulting from temperature changes, and the piezoelectric substrate and the metallic foil or the compensating substrate, each having a high thermal expansion coefficient, on both sides of the supporting substrate can prevent the composite substrate from being warped. This can improve the temperature characteristics of the composite substrate.

A method for forming a metal pattern, comprises the steps of:

(a) preparing a composite substrate according to any one described above and applying a photoresist to a surface of a piezoelectric substrate of the composite substrate;

(b) placing a photomask corresponding to a desired metal pattern on or above the piezoelectric substrate, irradiating the photoresist with light through the photomask, removing the photomask, and developing the photoresist to form a resist pattern; and (c) forming a metal layer on the surface on which the resist pattern is formed and subsequently removing the resist pattern on which an unnecessary portion of the metal layer is disposed to form the metal pattern.

According to this method for forming a metal pattern, when a composite substrate according to the first aspect of the present invention described above is prepared in the step (a), since at least one of an organic adhesive layer and a supporting substrate can absorb light used for photolithography, light passing through a photoresist can be absorbed by at least one of the organic adhesive layer and the supporting substrate. When a composite substrate according to the second aspect of the present invention described above is prepared in the step (a), light passing through a photoresist is absorbed by a second organic adhesive layer. In both cases, a portion of the photoresist on the back side of a photomask is therefore not exposed to light. Thus, in a composite substrate in which a piezoelectric substrate is bonded to a supporting substrate with an organic adhesive layer interposed therebetween, a desired metal pattern can be formed with a high degree of precision by a lift-off process using photolithography. In the step (b), the photomask disposed on top of the piezoelectric substrate to which the resist was applied is generally also referred to as a reticle.

DETAILED DESCRIPTION OF THE INVENTION

Figure 1:
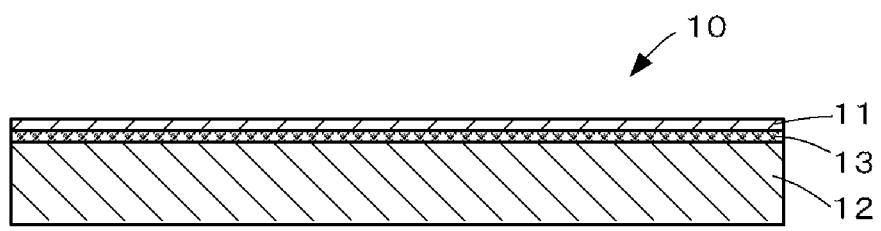
FIG. 1 is a schematic cross-sectional view of a composite substrate 10 for use in surface acoustic wave elements.

Embodiments of the present invention will be described below with reference to the drawings. FIG. 1 is a schematic cross-sectional view of a composite substrate 10 for use in surface acoustic wave elements. The composite substrate 10 is composed of a piezoelectric substrate 11, a supporting substrate 12, and an organic adhesive layer 13.

The piezoelectric substrate 11 is a substrate formed of a piezoelectric substance that can propagate a surface acoustic wave. When a desired metal pattern is formed on the composite substrate 10 by a lift-off process using photolithography, the metal pattern is formed on the surface of the piezoelectric substrate 11. The piezoelectric substrate 11 is transparent to light used for photolithography (hereinafter referred to as light used). As light used, i-line (365 nm) having a wavelength of 350 nm or more or g-line (436 nm) is used herein. Examples of the material of the piezoelectric substrate 11 include lithium tantalate, lithium niobate, lithium niobate-lithium tantalate solid solution single crystal, lithium borate, langasite, and crystal. Although the size of the piezoelectric substrate 11 is not limited, for example, the piezoelectric substrate 11 has a diameter in the range of 50 to 150 mm and a thickness in the range of 10 to 50 μm.

The supporting substrate 12 is a substrate bonded to the piezoelectric substrate 11. The material of the supporting substrate 12 may be an optically transparent material, for example, soda-lime-silica glass, borosilicate glass, non-alkali glass, or quartz glass. Borosilicate glass is used herein. The material of the supporting substrate 12 may be a material having a low light transmittance, such as silicon. Although the size of the supporting substrate 12 is not limited, for example, the supporting substrate 12 has a diameter in the range of 50 to 150 mm and a thickness in the range of 150 to 500 µm.

Figure 2:
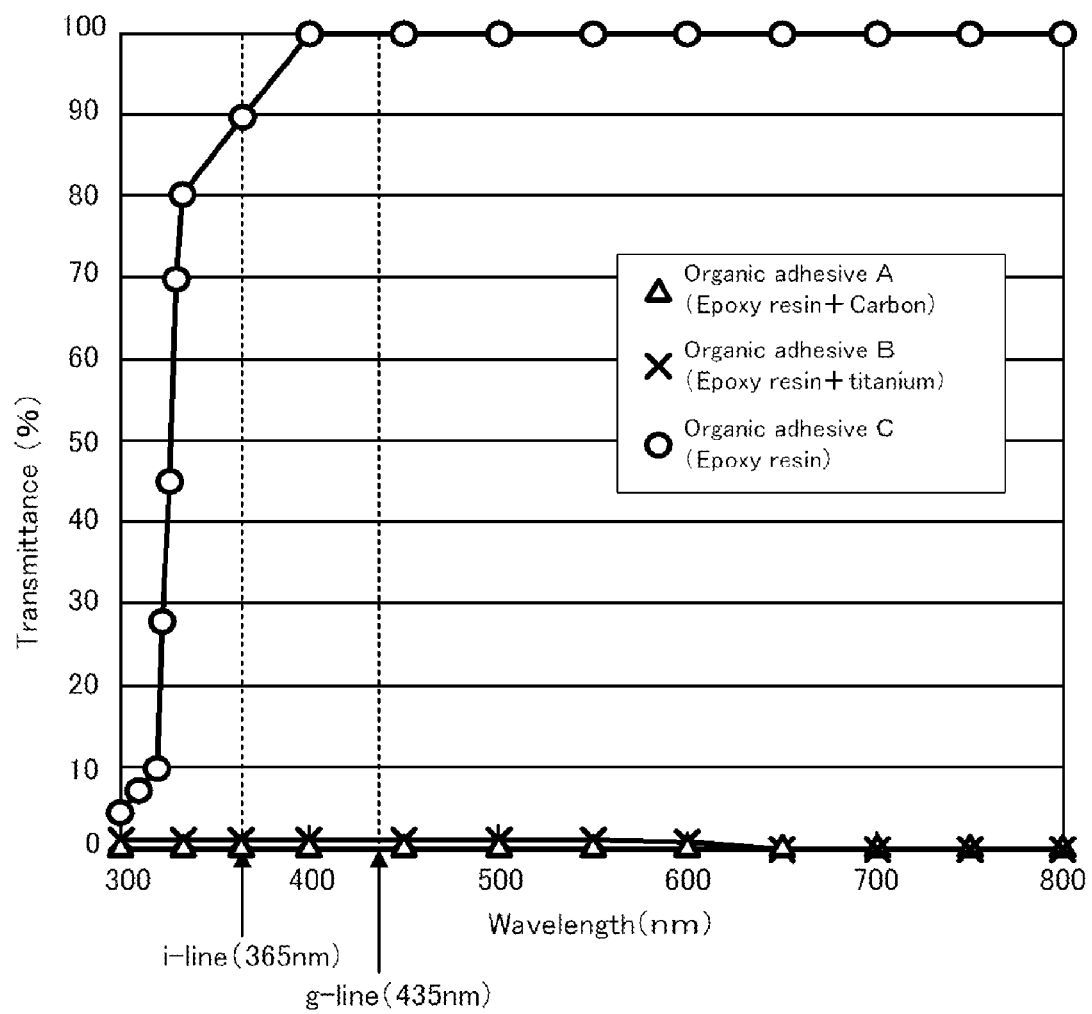
FIG. 2 is a graph of transmittance for organic adhesives A to C.

The organic adhesive layer 13 bonds the back side of the piezoelectric substrate 11 to the top of the supporting substrate 12. The organic adhesive layer 13 contains carbon or titanium as an ultraviolet-absorbing component in an adhesive composition of an epoxy resin to absorb light used. By way of example, FIG. 2 shows transmittance for an organic adhesive A in which 30% by weight carbon black (Average particle size 24 nm) is added to an epoxy resin, an organic adhesive B in which 33% by weight titanium black (Average particle size 90 nm) is added to an epoxy resin, and an organic adhesive C only composed of an epoxy resin. In FIG. 2, the organic adhesives A to C have a thickness of 1 µm. FIG. 2 shows that the i-line and g-line transmittances are approximately 0% for the organic adhesive A and approximately 0.5% for the organic adhesive B, showing the organic adhesives A and B have much lower transmittance than the organic adhesive C (the i-line and g-line transmittances are 90% or more). Although the organic adhesive layer 13 is formed of a material, such as the organic adhesive A or B, the weight percentage and the particle size of carbon or titanium added are not limited to the values described above and may be appropriately determined so that the organic adhesive layer 13 absorbs light used.

A process for forming a desired metal pattern on the surface of the composite substrate 10 will be described below with reference to FIGS. 3A to 3G. FIGS. 3A to 3G show schematic explanatory drawings (cross-sectional views) of a process for forming a desired metal pattern on the surface of the composite substrate 10.

Figure 3A:
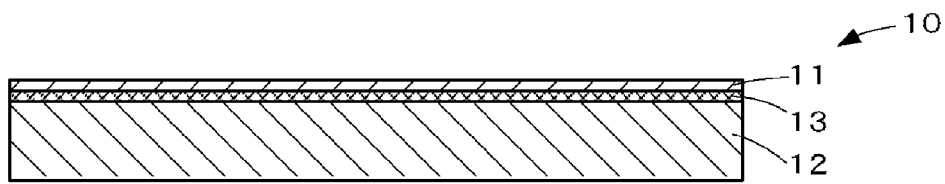
FIGS. 3A to 3G show schematic cross-sectional views of a process for forming a desired metal pattern on the surface of the composite substrate 10.
Figure 3B:
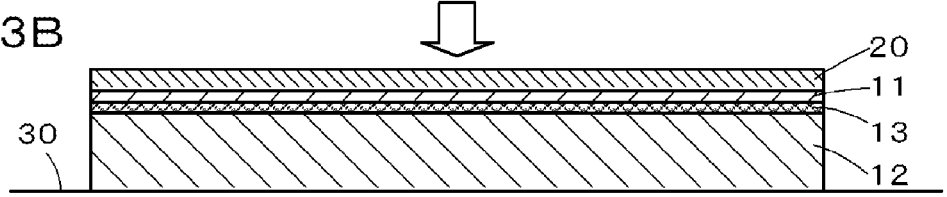
Figure 3C:
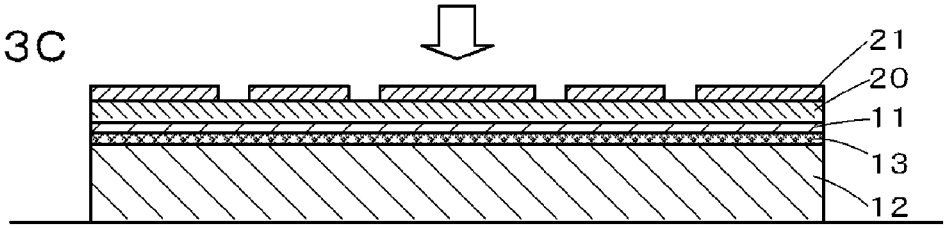
Figure 3D:
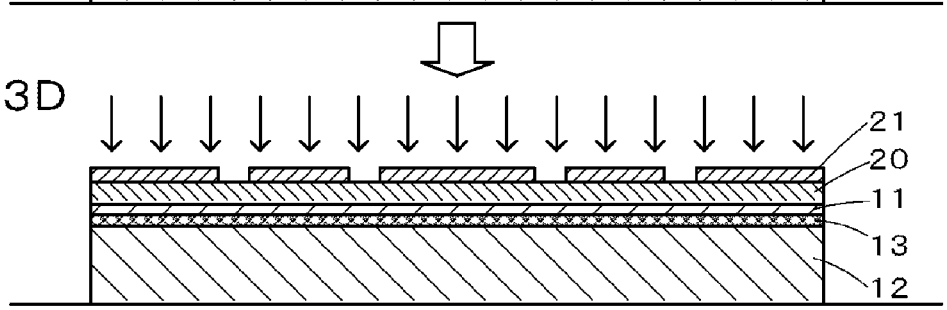

First, after the back side of a piezoelectric substrate 11 is bonded to the top of a supporting substrate 12 with an organic adhesive layer 13, the surface of the piezoelectric substrate 11 is polished to prepare a thin composite substrate 10 (see FIG. 3A). The composite substrate 10 is placed on a base 30. A positive photoresist 20 is uniformly applied to the surface of the piezoelectric substrate 11, for example, by spin coating (see FIG. 3B). A photomask 21 through which a portion corresponding to a desired metal pattern is vertically bored is then placed on the photoresist 20 (see FIG. 3C). Light used is emitted from above through the photomask 21 (see FIG. 3D). Subsequently, development of the photoresist 20 after removal of the photomask 21 yields a resist pattern 20a (see FIG. 3E). The light used passing through the piezoelectric substrate 11 is mostly absorbed by the organic adhesive layer 13. Thus, light used is not reflected by the back side of the supporting substrate 12 or the surface of the base 30 and does not reach the back side of a portion of the photoresist 20 covered with the photomask 21, and this portion is not exposed to light. A metal layer 14 is then formed, for example, by sputtering on the surface on which the resist pattern 20a is formed (see FIG. 3F). The resist pattern 20a on which an unnecessary portion of the metal layer is disposed is removed by dissolving it, for example, in an organic solvent, thus completing a metal pattern 14a (see FIG. 3G).

In the composite substrate 10 according to the present embodiment described in detail above, a portion of the photoresist on the back side of the photomask 21 is negligibly exposed to light. In the composite substrate 10 in which the piezoelectric substrate 11 is bonded to the supporting substrate 12 with the organic adhesive layer 13 interposed therebetween, therefore, a desired metal pattern can be formed with a high degree of precision by a lift-off process using photolithography.

The present invention is not limited to the above embodiment. Various modifications may be made within the technical scope of the present invention.

For example, in the embodiment described above, while the organic adhesive layer 13 that can absorb light used is used, a supporting substrate 12 that can absorb light used may alternatively or additionally be used. In this case, the effects achieved in the embodiment described above can also be achieved.

Figure 4:
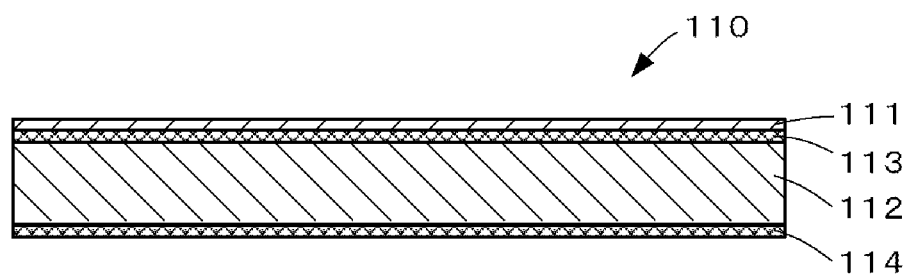
FIG. 4 is a schematic cross-sectional view of a composite substrate 110 according to a modification.
Figure 5:
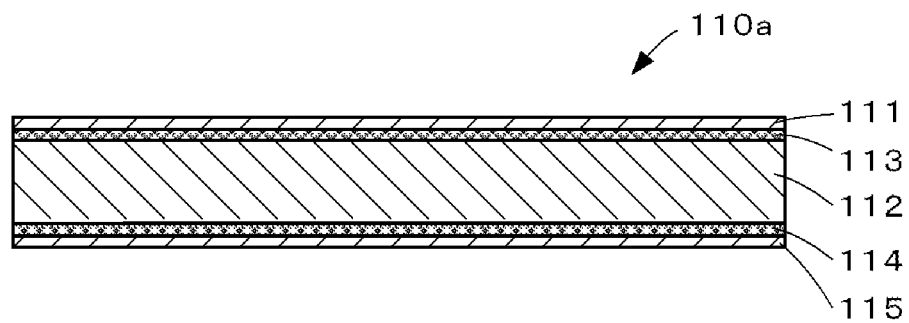
FIG. 5 is a schematic cross-sectional view of a composite substrate 110a according to a modification.

Although the composite substrate 10 has the structure illustrated in FIG. 1 in the embodiment described above, the composite substrate 10 may have a structure illustrated in FIG. 4. A composite substrate 110 illustrated in FIG. 4 includes a piezoelectric substrate 111, a supporting substrate 112, a first organic adhesive layer 113, and a second organic adhesive layer 114. The piezoelectric substrate 111 is the same as the piezoelectric substrate 11 described above. The supporting substrate 112 is a substrate formed of an optically transparent material. The first organic adhesive layer 113 is formed of an optically transparent material, such as an epoxy resin, an acrylic resin, and bonds the back side of the piezoelectric substrate 111 to the top of the supporting substrate 112. Like the organic adhesive layer 13 described above, the second organic adhesive layer 114 can absorb light used. In the composite substrate 110 having such a structure, when a metal pattern is formed on the piezoelectric substrate 111 using a photomask and a photoresist as in the composite substrate 10 described above, light used passes through the piezoelectric substrate 111, the first organic adhesive layer 113, and the supporting substrate 112, but is absorbed by the second organic adhesive layer 114. Thus, light used is not reflected by the back side of the supporting substrate 112 or the surface of a base and does not reach the back side of a portion of the photoresist covered with the photomask, and this portion is not exposed to light. The effects achieved with the composite substrate 10 described above can also be achieved. The composite substrate 10 may have a structure illustrated in FIG. 5. A composite substrate 110a illustrated in FIG. 5 has a metallic foil 115 on the back side of the second organic adhesive layer 114 in the composite substrate 110 illustrated in FIG. 4. That is, the second organic adhesive layer 114 bonds the back side of the supporting substrate 112 to the surface of the metallic foil 115. The same components of the composite substrate 110a illustrated in FIG. 5 as the components of the composite substrate 110 illustrated in FIG. 4 are denoted by the same reference numerals and will not be further described. In the composite substrate 110a, appropriate selection of the materials such that the piezoelectric substrate 111 and the metallic foil 115 have a thermal expansion coefficient higher than the thermal expansion coefficient of the supporting substrate 112 can improve the temperature characteristics of the composite substrate 110a. This is because the supporting substrate 112 can reduce variations in the size of the piezoelectric substrate 111 resulting from temperature changes, and the piezoelectric substrate 111 and the metallic foil 115, each having a higher thermal expansion coefficient than the supporting substrate 112, on both sides of the supporting substrate 112 can prevent the composite substrate 110a from being warped. Examples of the material of the metallic foil 115 include nickel, copper, steel, aluminum, bronze, and alloys thereof. The thickness of the metallic foil ranges from 10 to 50 μm (preferably from 10 to 30 μm), for example. The composite substrate 110*a* may include a compensating substrate having a higher thermal expansion coefficient than the supporting substrate 112 in place of the metallic foil 115. Also in this case, as with the metallic foil 115, the temperature characteristics of the composite substrate can be improved. Examples of the material of the compensating substrate include lithium tantalate, lithium niobate, lithium niobate-lithium tantalate solid solution single crystal, lithium borate, langasite, and crystal. The material of the compensating substrate may be the same as or different from the material of the piezoelectric substrate 111. The thickness of the compensating substrate ranges from 10 to 50 μm (preferably from 10 to 30 μm), for example. Also in the composite substrate 10, when the back side of the supporting substrate 12 is bonded to the surface of the metallic foil or the compensating substrate described above with an organic adhesive layer, the temperature characteristics can be improved. In this case, the material of the organic adhesive layer for bonding the supporting substrate 12 to the metallic foil is not limited to a material that can absorb light used.

Figure 3E:
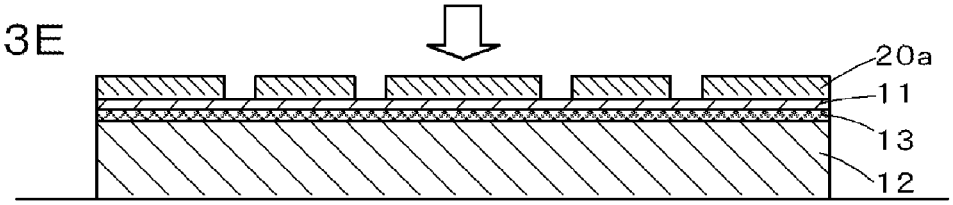
Figure 3F:
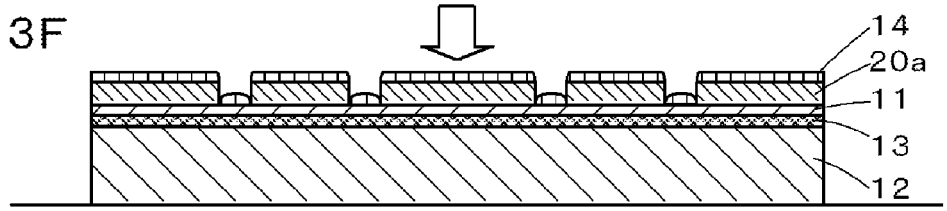
Figure 3G:
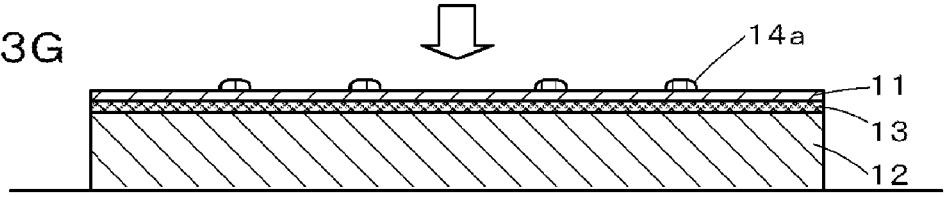

Although the positive photoresist 20 is used in the embodiment described above, a negative photoresist and a photomask that covers only a portion corresponding to a desired metal pattern may be used. In this case, the state illustrated in FIG. 3E is also achieved after development of the photoresist.

EXAMPLES

Example 1

As Example 1, a composite substrate 10 illustrated in FIG. 1 was fabricated, and a metal pattern was formed by a lift-off process using photolithography.

More specifically, first, a lithium tantalate substrate (hereinafter referred to as an LT substrate) having a thickness of 250 μm and a diameter of 100 mm, which served as a piezoelectric substrate 11, and a borosilicate glass substrate having a thickness of 250 μm and a diameter of 100 mm, which served as a supporting substrate 12, were prepared. The LT substrate was a 42° Y-cut H-propagation LT substrate, in which H denotes the propagation direction of a surface acoustic wave (SAW), and the cut angle was a rotated Y-cut. Subsequently, the above-mentioned organic adhesive A was applied to a surface of the borosilicate glass substrate by spin coating. The back side of the LT substrate was bonded to the surface of the borosilicate glass substrate on which the organic adhesive A was applied. Heating at 160° C. produced a laminated substrate in which an organic adhesive layer 13 had a thickness of 0.7 μm. The laminated substrate was polished such that the LT substrate had a thickness of 30 μm, thus forming the composite substrate 10.

A positive photoresist was then uniformly applied to the surface of the piezoelectric substrate 11 of the composite substrate 10 thus fabricated to a thickness of 0.4 μm by spin coating and was prebaked at 100° C. A photomask having a line and space (L/S) of 0.5 μm (that is, a linewidth of 0.5 μm and a distance between lines of 0.5 μm) was then placed on the photoresist. The composite substrate 10 was irradiated from above with light used (i-line) through the photomask while the composite substrate 10 was placed on a base 30 formed of aluminum. The photomask was then removed, and the composite substrate 10 was immersed in a resist developer to form a resist pattern. A metal layer formed of aluminum having a thickness of 0.14 μm was formed by sputtering on the surface on which the resist pattern was formed. The resist pattern on which an unnecessary portion of the metal layer was disposed was removed by dissolving it in an organic solvent, thus completing a metal pattern. Measuring the widths of the metal pattern thus completed at 100 positions, the metal pattern had a width of 0.5±0.05 μm with a standard deviation σ of 0.02 μm.

Example 2

A composite substrate 10 was fabricated, and a metal pattern was completed, as in Example 1 except that the material of the supporting substrate 12 was silicon instead of borosilicate glass. Measuring the widths of the metal pattern thus completed at 100 positions, the metal pattern had a width of 0.5±0.05 μm with a standard deviation σ of 0.02 μm.

Comparative Example 1

A composite substrate 10 was fabricated, and a metal pattern was completed, as in Example 1 except that the above-mentioned organic adhesive C was applied to form the organic adhesive layer 13. Measuring the widths of the metal pattern thus completed at 100 positions, the metal pattern had a width of 0.7±0.15 μm with a standard deviation σ of 0.05 μm.

Comparative Example 2

A composite substrate 10 was fabricated, and a metal pattern was completed, as in Example 2 except that the above-mentioned organic adhesive C was applied to form the organic adhesive layer 13. Measuring the widths of the metal pattern thus completed at 100 positions, the metal pattern had a width of 0.6±0.10 μm with a standard deviation σ of 0.03 μm.

The results of Examples 1 and 2 and Comparative Examples 1 and 2 show that the metal pattern widths in Examples 1 and 2, in which the organic adhesive layer 13 was formed of the organic adhesive A, are closer to the desired value (0.5 μm) than the metal pattern widths in Comparative Examples 1 and 2, in which the organic adhesive layer 13 was formed of the organic adhesive C, indicating that the desired metal pattern was formed with a high degree of precision in Examples 1 and 2.

Figure 6A:
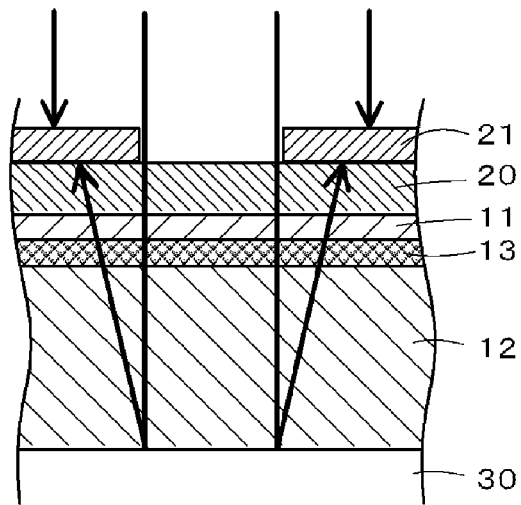
FIGS. 6A to 6C show schematic fragmentary sectional views of a process for forming a metal pattern according to Comparative Example 1.
Figure 6B:
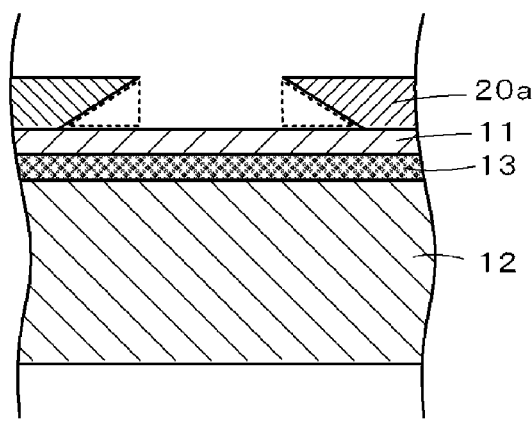
Figure 6C:
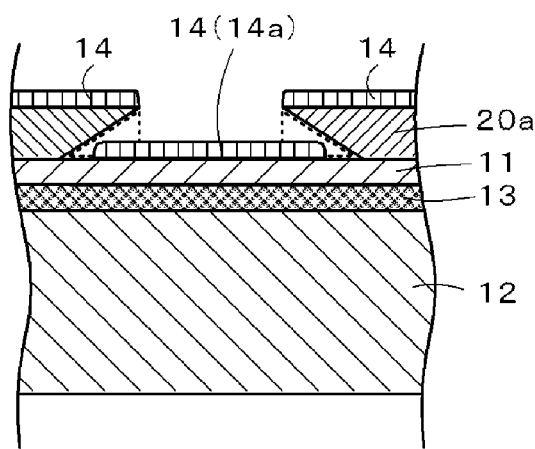
Figure 7A:
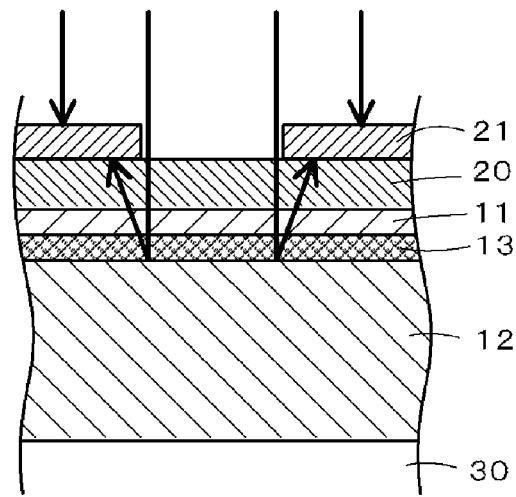
FIGS. 7A to 7C show schematic fragmentary sectional views of a process for forming a metal pattern according to Comparative Example 2.
Figure 7B:
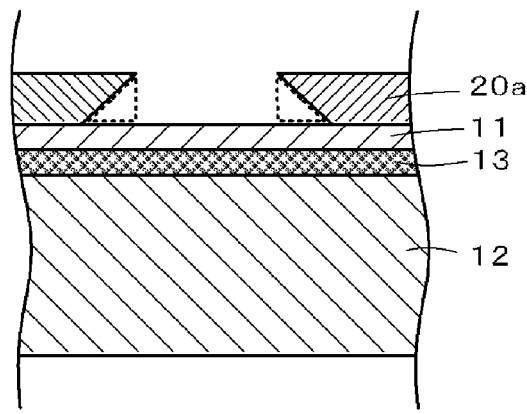
Figure 7C:
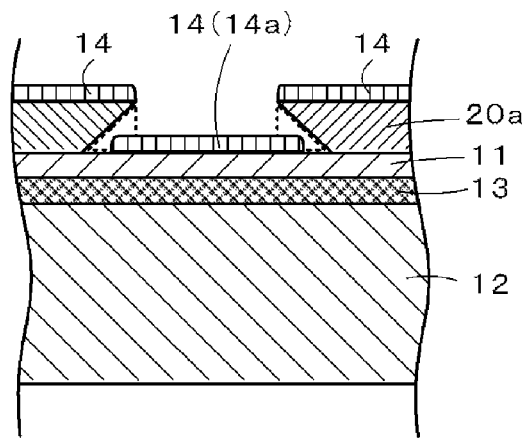
Figure 8:
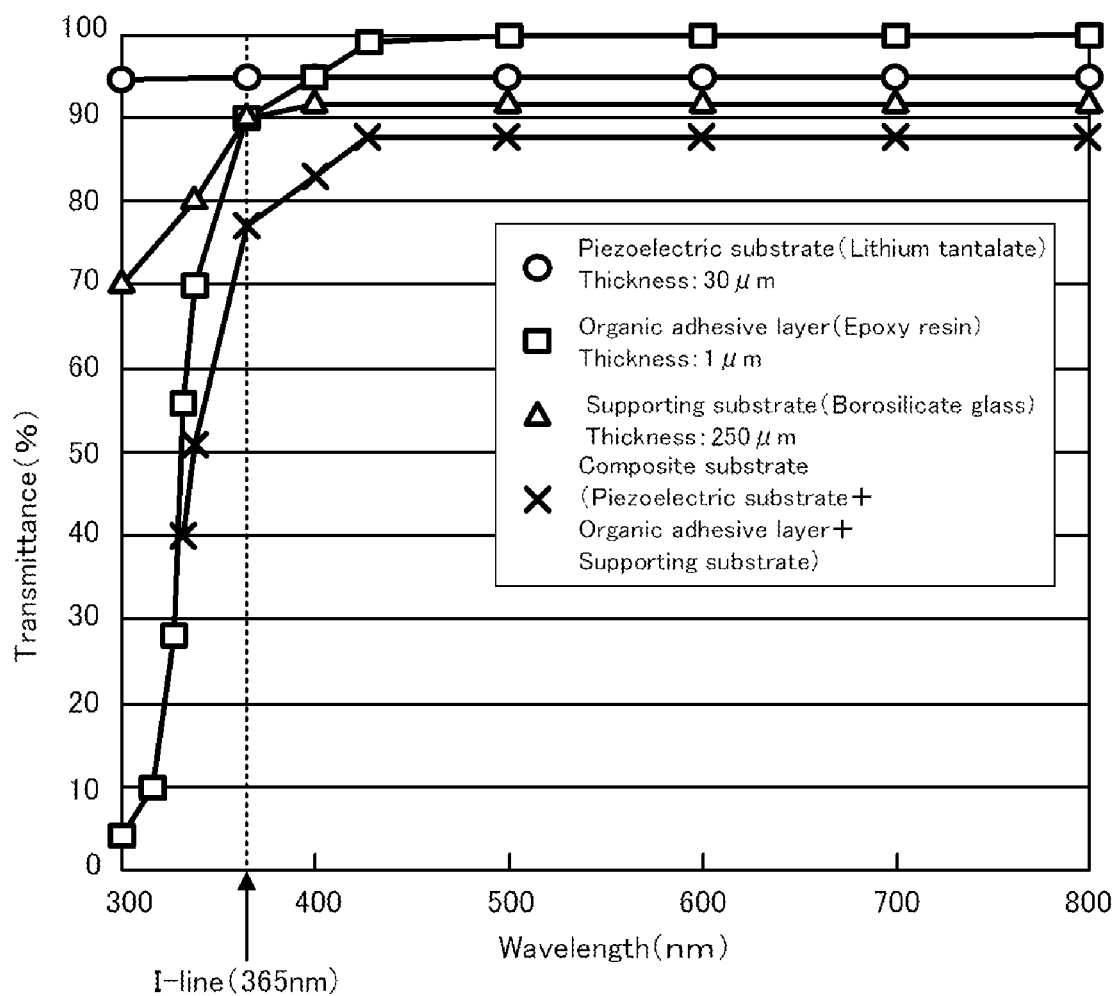
FIG. 8 is a graph of transmittance for a piezoelectric substrate, an organic adhesive layer, a supporting substrate, and a composite substrate composed thereof, according to a conventional example.

FIGS. 6A to 6O and 7A to 7C are schematic explanatory drawings (fragmentary sectional views) of part of a process for forming a desired metal pattern in Comparative Examples 1 and 2, respectively. The steps in FIGS. 6A to 6O and 7A to 7C correspond to the steps in FIG. 3D to 3F according to the embodiment described above. When the composite substrate 10 according to Comparative Example 1 is irradiated with light used while the photoresist 20 and the photomask 21 are disposed, the light used passes through the photoresist 20, the piezoelectric substrate 11, the organic adhesive layer 13, and the supporting substrate 12, is reflected by the the surface of a base 30 on which the composite substrate 10 is disposed, and reaches the back side of a portion of the photoresist 20 covered with the photomask 21 (see FIG. 6A). In the composite substrate 10 according to Comparative Example 2, light used passes through the photoresist 20, the piezoelectric substrate 11, and the organic adhesive layer 13, is reflected by the surface of the supporting substrate 12 formed of silicon, and reaches the back side of a portion of the photoresist 20 covered with the photomask 21 (see FIG. 7A). A portion of the photoresist 20 that is covered with the photomask 21 and should not be removed is partly removed by the resist developer (the portions within the dotted line in FIGS. 6B and 7B are removed). In the following formation of the metal layer 14, the metal layer 14, which serves as a metal pattern 14a, is also formed in a portion in which the photoresist 20 was partly removed. The metal pattern 14a thus formed therefore has a width larger than a desired width (see FIGS. 6C and 7C). Probably because of the reason described above, the width and variations in the width of the metal pattern 14a are larger in Comparative Examples 1 and 2 than in Examples 1 and 2. In Examples 1 and 2, the organic adhesive layer 13 absorbs light used and thereby prevents an increase and variations in the width of the metal pattern 14a, and the desired metal pattern 14a can be formed with a high degree of precision.

The present application claims the benefit of the priority from Japanese Patent Application No. 2008-331010 filed on Dec. 25, 2008, the entire contents of which are incorporated herein by reference.

What it claimed is:

1. A composite substrate, in which
a piezoelectric substrate that is transparent to light used for photolithography and a supporting substrate for supporting the piezoelectric substrate are bonded together via an organic adhesive layer,
wherein at least one of the supporting substrate and the organic adhesive layer absorbs light used for photolithography having a wavelength of 350 nm or more.

2. The composite substrate according to claim 1, wherein the organic adhesive layer is formed of a material in which a light-absorbing component is added to an adhesive composition.

3. The composite substrate according to claim 2, wherein the supporting substrate is a supporting substrate formed of silicon.

4. The composite substrate according to claim 1, wherein the supporting substrate is formed of a material in which a light-absorbing component is added to a glass composition.

5. The composite substrate according to claim 1, wherein the organic adhesive layer is formed of a material having a light-absorbing component selected from at least one of titanium and carbon.

6. A composite substrate, comprising:
a piezoelectric substrate that is transparent to light used for photolithography;
a supporting substrate that is transparent to light used for photolithography;
a first organic adhesive layer that is transparent to light used for photolithography and bonds the piezoelectric substrate and the supporting substrate together; and
a second organic adhesive layer formed on a surface of the supporting substrate opposite the first organic adhesive layer,
wherein the second organic adhesive layer absorbs light used for photolithography having a wavelength of 350 nm or more.

7. The composite substrate according to claim 6, further comprising:
a metallic foil or a compensating substrate bonded to the supporting substrate via the second organic adhesive layer,
wherein the piezoelectric substrate has a higher thermal expansion coefficient than the supporting substrate, and
the metallic foil or the compensating substrate has a higher thermal expansion coefficient than the supporting substrate.

8. The composite substrate according to claim 6, wherein the second organic adhesive layer is formed of a material having a light-absorbing component selected from at least one of titanium and carbon.

* * * * *